United States Patent [19]

Maue

[11] Patent Number: 4,802,869

[45] Date of Patent: Feb. 7, 1989

[54] PROBEABLE ELECTRICAL CONNECTOR

[75] Inventor: H. Winston Maue, Farmington Hills, Mich.

[73] Assignee: United Technologies Automotive, Inc., Dearborn, Mich.

[21] Appl. No.: 86,322

[22] Filed: Aug. 17, 1987

[51] Int. Cl.$^4$ .......................................... H01R 13/40
[52] U.S. Cl. .................................. 439/587; 439/912; 439/752; 439/271
[58] Field of Search ............... 439/482, 912, 483, 488, 439/489, 271-277, 54, 46, 752; 324/158 D, 158 P

[56] References Cited

U.S. PATENT DOCUMENTS

| 3,176,261 | 3/1965 | Greco et al. | 339/176 |
|---|---|---|---|
| 3,271,729 | 9/1966 | Bakker et al. | 339/217 |
| 3,568,136 | 3/1971 | Wells | 439/638 |
| 3,654,592 | 4/1972 | Primorac | 339/176 MP |
| 3,909,767 | 9/1975 | Williamson et al. | 337/264 |
| 4,066,325 | 1/1978 | Pearce, Jr. et al. | 339/176 MP |
| 4,176,895 | 12/1979 | Aldridge | 439/912 |
| 4,342,497 | 8/1982 | Morrison | 439/912 |
| 4,346,959 | 8/1982 | Daugherty et al. | 339/217 S |
| 4,611,872 | 9/1986 | Ito et al. | 339/94 M |

FOREIGN PATENT DOCUMENTS 2854903 7/1979 Fed. Rep. of Germany ...... 439/482

Primary Examiner—David Pirlot

[57] ABSTRACT

A probeable electrical connector assembly including a set of or a plurality of mating terminals (6) and (8) arranged in a matrix and accommodated in mating housings (2) and (4). Passages (12,14) having openings (11) are incorporated in housings (2) and (4) and allow the insertion of a probe (16) to make electrical contact with a preselected terminal of a joined terminal union (10). In this manner electrical measurements may be made with respect to the terminal without first disassembling the connection. Undesired contaminants are prevented from entering openings (11) by a reusable seal (20) which is positioned about each housing.

5 Claims, 2 Drawing Sheets

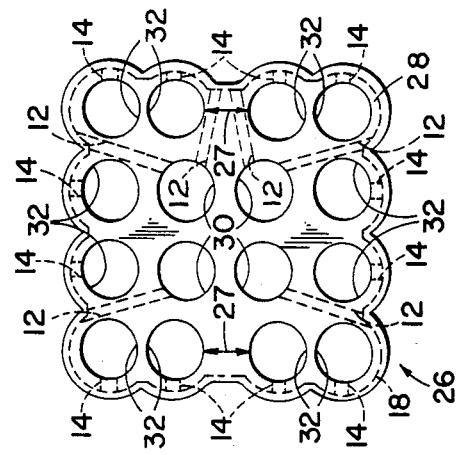
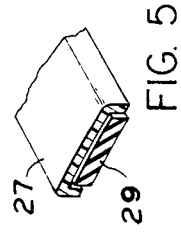
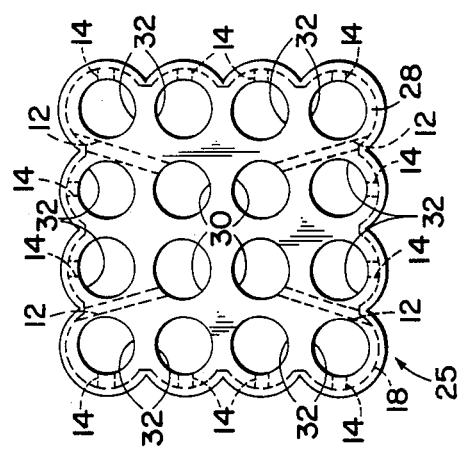
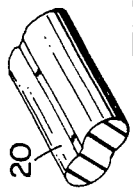
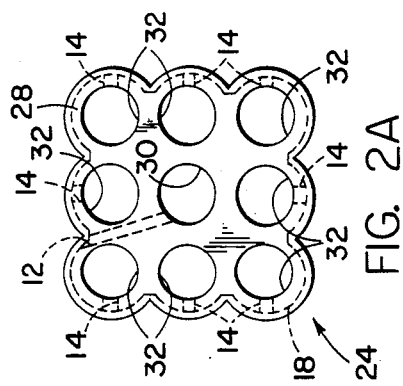
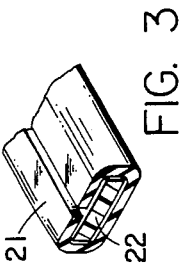

PROBEABLE ELECTRICAL CONNECTOR

TECHNICAL FIELD

The field of art to which this invention pertains is electrical connectors for conductor wires, and specifically splash-proof connectors and non-sealed connectors, both being particularly suitable for use with electrical power distribution networks in automobiles.

BACKGROUND ART

Electrical connectors are widely used to form a junction between one or more conductor wires which usually have mating terminals attached to the ends of the wires that are to be joined. In automotive applications particularly, connectors are generally fabricated from an insulating material such as plastic and are designed not only to insulate the joined mating terminals but also to protect the joined terminals from liquid that may be sprayed upon the connectors.

The wiring of a motor vehicle progresses from the electrical source, through mated terminal pairs, and continues to a controlled load such as an electrical component. For servicing reasons connectors are designed to be reusable numerous times in order to facilitate the diagnosing and replacing of faulty electrical components and for checking electrical continuity of a wire segment in an electrical wiring assembly of a motor vehicle. In the course of diagnosing an electrical malfunction in a wire assembly, the diagnostician must disconnect the connector and take measurements from the terminals located in the now-opened connector. By disconnecting the terminals, any potential historical evidence of an electrical fault within the connector may be destroyed, hence there is a need for a connector which lends itself to diagnostics without first having to be disassembled.

DISCLOSURE OF THE INVENTION

An object of the invention is to provide a probeable connector assembly having at least two mating housings in which a probe may be inserted into the interior of the connector through passages in order to make electrical contact with at least one of a plurality of terminals that are housed therein.

A further object of the invention is to provide a probeable connector assembly which has a reusable splash-proof seal for preventing liquids or other undesired contaminants from entering into the interior of the connector through the passages and subsequently interfering with the electrical union of any mated terminals that are housed within the connector assembly.

A further object of the invention is to provide a probeable connector assembly which has a seal retainer used for enhancing the positioning and retention of the splash-proof seal over a predetermined, circumferential portion of the connector assembly.

A still further object of the invention is to provide a connector assembly in which mating terminals are arranged in a matrix having both inner and outer position terminals and having passages leading to each terminal from a preselected common circumferential grooved portion of the connector. The grooved portion aids in the sealing of the passages and the retention of a seal thereto. Additionally the matrix may be symmetrical or asymmetrical in order to provide clearance for passages to bypass outer position terminals and reach inner position terminals.

The above objects are achieved according to the present invention by providing an electrical connector assembly having a plurality of mating electrical connector housings containing means for accommodating mating electrical terminals and passages leading to the electrical terminals which allow a probe to be inserted to make contact with a selected terminal.

The present invention further provides mating housings with means to accommodate mating terminals arranged in a matrix with passages leading to selected terminals, each housing having a rear portion in which openings to the passages are located circumferentially about the rear portion of each housing and a circumferential groove positioned over the openings for engaging a seal with an optional seal carrier in order to provide means for sealing the openings of the passages.

The foregoing and other features and advantages of the present invention will become more apparent from the following description, drawings and appended claims.

BRIEF DESCRIPTION OF THE DRAWINGS

FIGS. 2A, 2B and 2C are a series of diagrammatic views of various embodiments of a terminal matrix and passages within the connector assembly.

FIG. 3 is a perspective view of an embodiment of the seal with a seal carrier.

FIG. 4 is a perspective view of a seal without a seal carrier.

FIG. 5 is a perspective view of a seal with an external seal carrier.

BEST MODE FOR CARRYING OUT THE INVENTION

Figure 1B:
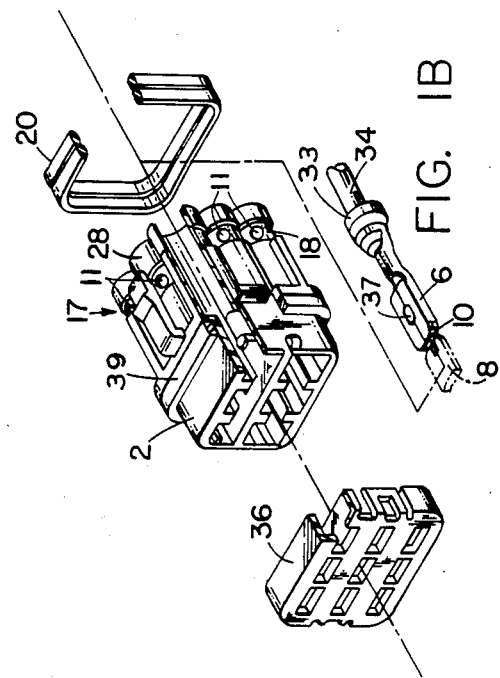
FIGS. 1A and 1B are collectively an exploded perspective view of the probeable electrical connector assembly showing the connector housings and the positioning of mating electrical terminals and the exterior portions of the passages.
Figure 1A:
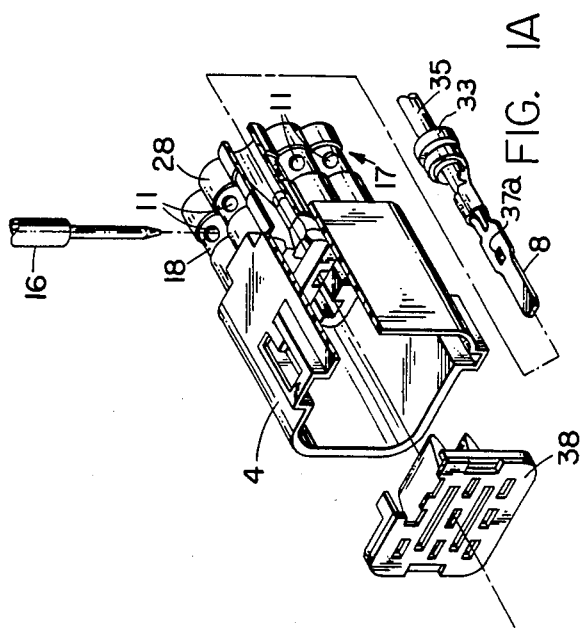

Referring now to FIGS. 1A and 1B, a pair of probeable mating sealed connector housings 2 and 4 are shown. Housings 2 and 4 are constructed from an insulating material such as plastic and each housing has rear portions 28 in which mating electrical terminals 6 and 8 may be inserted. Mating terminals 6 and 8 are respectively attached to outgoing conductor wires 34 and 35. Mating terminals 6 and 8 form terminal union 10, as shown in FIG. 1B, when connector housings 2 and 4 are subsequently fitted together. Housings 2 and 4 may be constructed to house a single set of mating terminals 6 and 8 or numerous sets of mating terminals 6 and 8. Terminal insulators 36 and 38 are located in housings 2 and 4, respectively, and are used for maintaining terminals 6 and 8 in an orderly fashion to facilitate the joining of housings 2 and 4, and to prevent undesired short circuits among various sets of terminals 6 and 8 within the connector assembly.

Terminals 6 and 8 as shown in FIGS. 1A and 1B, are secured by the mating retainers within connector housings 2 and 4 by the engagement of locking slots 37 and 37a respectively, thereby providing a primary locking means. Terminal insulators 36 and 38 additionally form secondary locking means by retaining the mating retainers within connector housings 2 and 4 with locking slots 37 and 37A of terminal 6 and 8 respectively.

Housing seal 39 and terminal seals 33 in this particular housing provide means for sealing housings 2 and 4. Housing seal 39 and terminal seals 33 may be eliminated if a sealed housing is not required.

The symmetrical terminal matrix 24 of FIG. 2A shows positioning of the terminals within the connector assembly in a symmetrical manner. Terminals located around the periphery of matrix 24 are defined as outer position terminals 32, and terminals surrounded by other terminals are defined as inner position terminals 30.

Returning to FIGS. 1A and 1B, passages defined as inner passages (not shown) extend radially from rear portion 28 of housings 2 and 4 to inner position terminals (not shown) and passages defined as outer passages 14 extend radially from rear portion 28 of housings 2 and 4 to outer position terminals (not shown). Both types of passages have openings 11 located in circumferential groove 18 in rear portion 28 of housings 2 and 4. Probe 16 is shown positioned for insertion through an opening 11 into a passage to make electrical contact with a terminal.

FIG. 2B further illustrates symmetrical matrix 25 with a possible layout of both inner and outer passages 12 and 14, respectively. Probe 16, as shown in FIG. 1A, may be inserted into any one passage and make contact with a preselected terminal in order to take electrical measurements at that terminal without disconnecting connector housings 2 and 4. FIG. 2B illustrates a symmetrical matrix 25 having four inner positioned terminals 30 and four corresponding inner passages 12 extending radially inward from rear portion 28. Larger matrices may be constructed in a similar fashion or inner passages 12 may be eliminated thereby leaving inner position terminals 30 without the benefit of being probeable.

It is not necessary, nor is it always desirable to arrange terminals 6 and 8 in a symmetrical matrix. Due to increasing the number of terminals in a matrix and any possible overall size limitations of the assembled connector assembly, arranging terminals 6 and 8 such as in an asymmetrical matrix 26 as shown in FIG. 2C, may be required in order to provide clearance for inner passages 12 to bypass outer position terminals 32. Gap space 27 is the result of placing preselected terminals in a staggered manner with respect to nearby terminals. FIG. 2C further illustrates the increased clearance available for inner passages 12 located in gap space 27 as compared to inner passages 12 not being located in gap space 27. By arranging terminals 6 and 8 in a staggered manner, improper orientation of housing 2 with respect to housing 4 upon assembling may be avoided, however, housings 2 and 4 may be indexed with each other if a symmetrical matrix is chosen.

FIGS. 1A and 1B show that passage openings 11 of both inner and outer passages 12 and 14 are positioned about a preselected common circumferential portion 17 of rear portion 28 of housings 2 and 4. By doing so, a snugly-fitting seal 20 made from a material such as silicone rubber may be positioned over passage openings 11. A circumferential groove 18 may be incorporated over preselected common circumferential portion 17 in rear portion 28 for better retainment of seal 20 when seal 20 is positioned over passage openings 11.

The circumferential groove 18 need not be contoured, but may have a generally flat surface instead of the scalloped surface as shown.

FIGS. 3, 4 and 5 illustrate embodiments of a seal designed to be assembled to and removed from the housing to allow the passages to be sealed, and when removed, allows the insertion of a probe through the passages. Removal of the seal may be achieved by simply sliding the seal back so that it continues to be in an concentric relationship with wires 34 or 35. After probing the terminal the seal is returned to its original position. FIG. 4 illustrates seal 20 designed to be used without a seal carrier. FIG. 3 illustrates seal 21 which is designed to be used with internal seal carrier 22 and which can be used with or without circumferential groove 18. FIG. 5 illustrates seal 29 which is designed to be used with external seal carrier 27 which can also be used with or without circumference groove 18.

Seal carrier 22 or 27 may be made of any material, such as plastic, which is sufficiently rigid to maintain a given shape but flexible enough to allow the seal and the seal carrier to be easily positioned over passage openings 11. The seal and corresponding carrier (if used) should fit snugly over passage openings 11, yet be flexible enough to allow a diagnostician to slide the seal on and off the housing easily.

Although the invention has been shown and described with respect to detailed embodiments thereof, it will be understood by those skilled in the art that various changes in form and detail thereof may be made without departing from the spirit and scope of the invention.

I claim:

1. A probeable electrical connector assembly comprising:
   (a) a plurality of mating electrical connector housings;
   (b) each of said mating housings containing means for accommodating at least one terminal which when mated with a corresponding terminal in a mating housing forms a terminal union;
   (c) each of said mating housings containing a passage leading to at least one terminal located within the housing whereby the passage provides means for allowing a probe to be inserted to make electrical contact with the terminal when the mating housings are connected to form the assembly;
   (d) each of said mating housings having a plurality of passages, said mating housing also having a circumferential groove and wherein at least one of the passages terminates at the groove; and
   (e) a removable seal sized to fit snugly in the groove whereby the seal in combination with the groove provides reusable means for covering the passages.

2. A probeable electrical connector assembly as set forth in claim 1 and further comprising:
   a seal carrier which accommodates and retains said seal thereby enhancing the sealing characteristics of the seal and the positioning and any subsequent repositioning of the seal in said groove.

3. A probeable electrical connector assembly comprising:
   (a) a plurality of mating electrical connector housings, each having a rear portion;
   (b) each housing having a plurality of terminals located therein, said terminals being arranged in a matrix;
   (c) each housing containing a plurality of individual passages being located about a preselected common circumferential portion of the rear portion of each housing;

(d) the passages extending to selected outer position terminals of the matrix and being sized to allow a probe to be inserted therein to make electrical contact with the terminals;

(e) the rear portion of each housing having a circumferential groove positioned to engage the radially-outward end of the passages of the rear portion of each housing;

(f) a seal sized to fit snugly in the groove; and (g) a seal carrier which accommodates and retains said seal whereby the seal and the seal carrier provide means for sealing the passage at the groove.

4. A probeable electrical connector assembly as set forth in claim 3 and further comprising:

said terminal matrix having inner and outer position terminals; and at least one inner passage positioned to extend from the circumferential groove bypassing an outer position terminal to extend to an inner position terminal thereby providing access for a probe to make electrical contact with an inner position terminal in the matrix.

5. The probeable electrical connector assembly as set forth in claim 4 and further comprising:

said terminal matrix having outer position terminals which have a gap space therebetween; and at least one gap space being sized to allow an inner passage to extend therethrough.

* * * * *